(12) United States Patent
Salapakkam et al.

(10) Patent No.: US 9,615,482 B2
(45) Date of Patent: Apr. 4, 2017

(54) SHAPED HEAT SINKS TO OPTIMIZE FLOW

(75) Inventors: Pradeep Chandra Babu Salapakkam, Schenectady, NY (US); Ri Li, Niskayuna, NY (US); Mehmet Arik, Niskayuna, NY (US); William Dwight Gerstler, Niskayuna, NY (US); Bryan Patrick Whalen, Ganesvoort, NY (US)

(73) Assignee: General Electric Company, Schenectady, NY (US)

( * ) Notice: Subject to any disclaimer, the term of this patent is extended or adjusted under 35 U.S.C. 154(b) by 769 days.

(21) Appl. No.: 12/965,454

(22) Filed: Dec. 10, 2010

(65) Prior Publication Data

US 2011/0139429 A1    Jun. 16, 2011

Related U.S. Application Data

(60) Provisional application No. 61/285,564, filed on Dec. 11, 2009.

(51) Int. Cl.
| | | |
|---|---|---|
| F28F 7/00 | (2006.01) | |
| H05K 7/20 | (2006.01) | |
| H01L 23/467 | (2006.01) | |
| F28D 21/00 | (2006.01) | |
| F28F 3/02 | (2006.01) | |

(52) U.S. Cl.
CPC ............ *H05K 7/20* (2013.01); *H01L 23/467* (2013.01); *F28D 2021/0029* (2013.01); *F28F 3/02* (2013.01); *F28F 2250/02* (2013.01); *H01L 2924/0002* (2013.01)

(58) Field of Classification Search
CPC ... H01L 23/34; H01L 23/467; H05K 7/20136; H05K 7/20154

USPC .................................. 165/80.3, 185, 123
See application file for complete search history.

(56) References Cited

U.S. PATENT DOCUMENTS

| | | | |
|---|---|---|---|
| 2,766,619 A | * | 10/1956 | Tribus et al. .............. 73/170.26 |
| 3,692,414 A | | 9/1972 | Rosteman |
| 3,710,128 A | | 1/1973 | Kubisiak |
| 4,583,854 A | | 4/1986 | Lozar |
| 4,736,247 A | | 4/1988 | Graham |
| 4,745,290 A | | 5/1988 | Frankel |
| 4,966,460 A | | 10/1990 | Kahley |
| 5,299,090 A | | 3/1994 | Brady et al. |

(Continued)

FOREIGN PATENT DOCUMENTS

| | | |
|---|---|---|
| CN | 1471159 A | 1/2004 |
| DE | 218672 A1 | 2/1985 |

(Continued)

OTHER PUBLICATIONS

Dalgleish et al., "Laser-Based Inspection of Cutting Tools for Advanced Manufacturing Systems", Factory 2000—Advanced Factory Automation, Conference Publication No. 398, pp. 502-508, Oct. 305, 1994.

(Continued)

*Primary Examiner* — Ryan J Walters
*Assistant Examiner* — Jason Thompson
(74) *Attorney, Agent, or Firm* — Ziolkowski Patent Solutions Group, SC; Jean K. Testa

(57) ABSTRACT

A heat sink with shape-optimized fins provides for improved heat transfer. Synthetic jets create vortices which enhance heat transfer and cooling of downstream fins, while the shape of the fins limits pressure drop in the flow over the cooling fins.

17 Claims, 3 Drawing Sheets

(56) References Cited

U.S. PATENT DOCUMENTS

| | | | |
|---|---|---|---|
| 5,445,215 A | 8/1995 | Herbert | |
| 5,477,371 A | 12/1995 | Shafir | |
| 5,568,260 A | 10/1996 | Schneiter | |
| 5,570,186 A | 10/1996 | Satzger | |
| 5,708,279 A | 1/1998 | Cheng | |
| 5,781,411 A * | 7/1998 | Feenstra | 361/704 |
| 5,846,081 A | 12/1998 | Bushway | |
| 5,940,272 A | 8/1999 | Emori et al. | |
| 6,123,145 A | 9/2000 | Glezer et al. | |
| 6,128,188 A * | 10/2000 | Hanners | 361/694 |
| 6,166,904 A | 12/2000 | Kitahara et al. | |
| 6,296,048 B1 | 10/2001 | Sauer | |
| 6,371,200 B1 * | 4/2002 | Eaton | 165/80.3 |
| 6,588,497 B1 * | 7/2003 | Glezer et al. | 165/84 |
| 6,666,261 B2 | 12/2003 | Yang et al. | |
| 6,722,581 B2 | 4/2004 | Saddoughi | |
| 6,788,807 B1 | 9/2004 | Norita | |
| 6,817,405 B2 * | 11/2004 | Kamath et al. | 165/80.3 |
| 6,927,863 B2 | 8/2005 | Gurny | |
| 6,937,472 B2 | 8/2005 | Pokhama | |
| 7,023,697 B2 | 4/2006 | Pokharna et al. | |
| 7,027,145 B2 | 4/2006 | Segall | |
| 7,055,329 B2 | 6/2006 | Martens et al. | |
| 7,204,615 B2 | 4/2007 | Arik et al. | |
| 7,249,625 B2 | 7/2007 | Duan | |
| 7,252,140 B2 | 8/2007 | Glezer et al. | |
| 7,263,837 B2 | 9/2007 | Smith | |
| 7,269,471 B2 | 9/2007 | Kadono | |
| 7,286,347 B2 | 10/2007 | Wang et al. | |
| 7,307,841 B2 | 12/2007 | Berlin et al. | |
| 7,336,486 B2 | 2/2008 | Mongia | |
| 7,607,470 B2 | 10/2009 | Glezer et al. | |
| 7,891,410 B1 * | 2/2011 | Monson | F28F 3/02 165/80.2 |
| 7,990,705 B2 | 8/2011 | Bult et al. | |
| 8,120,908 B2 | 2/2012 | Arik et al. | |
| 8,342,819 B2 | 1/2013 | Arik et al. | |
| 2002/0154396 A1 | 10/2002 | Overbeck | |
| 2004/0263863 A1 | 12/2004 | Rogers | |
| 2005/0121171 A1 | 6/2005 | Mukasa et al. | |
| 2006/0021736 A1 * | 2/2006 | Tran | 165/80.3 |
| 2006/0042782 A1 * | 3/2006 | Chen | 165/80.3 |
| 2006/0196638 A1 | 9/2006 | Glezer et al. | |
| 2006/0267184 A1 | 11/2006 | Kinsman et al. | |
| 2007/0119573 A1 | 5/2007 | Mahalingam et al. | |
| 2007/0124015 A1 | 5/2007 | Chen et al. | |
| 2008/0043438 A1 | 2/2008 | Refai-Ahmed | |
| 2008/0148590 A1 | 6/2008 | Hayashi | |
| 2008/0156462 A1 | 7/2008 | Arik et al. | |
| 2008/0277103 A1 | 11/2008 | Yamada et al. | |
| 2009/0145581 A1 * | 6/2009 | Hoffman et al. | 165/80.3 |
| 2009/0174999 A1 | 7/2009 | Sauciuc et al. | |
| 2009/0321046 A1 * | 12/2009 | Hernon et al. | 165/80.3 |
| 2009/0321056 A1 * | 12/2009 | Ran et al. | 165/104.34 |
| 2010/0014251 A1 | 1/2010 | Refai-Ahmed | |
| 2010/0018675 A1 | 1/2010 | Aarts et al. | |
| 2010/0038056 A1 | 2/2010 | Ellsworth et al. | |
| 2010/0110630 A1 | 5/2010 | Arik et al. | |
| 2010/0110635 A1 | 5/2010 | Jones et al. | |
| 2011/0024092 A1 | 2/2011 | Gerlach | |
| 2011/0114287 A1 | 5/2011 | Arik et al. | |
| 2011/0139429 A1 | 6/2011 | Salapakkam et al. | |

FOREIGN PATENT DOCUMENTS

| | | |
|---|---|---|
| DE | 911027 U1 | 10/1991 |
| EP | 0385090 A1 | 9/1990 |
| EP | 1580521 A2 | 9/2005 |
| EP | 1762725 A1 | 3/2007 |
| EP | 1797992 A1 | 6/2007 |
| EP | 2239775 A2 | 10/2010 |
| JP | 05251883 A | 9/1993 |
| JP | 09139448 A | 5/1997 |
| JP | 1051912 A | 2/1998 |
| JP | 2001332671 A | 11/2001 |
| JP | 2001345585 A | 12/2001 |
| JP | 2002026214 A | 1/2002 |
| JP | 2005011922 A | 1/2005 |
| JP | 2006522479 A | 9/2006 |
| JP | 2007192210 A | 8/2007 |
| JP | 2008008230 A | 1/2008 |
| JP | 2008196989 A1 | 8/2008 |
| JP | 2011103395 A | 5/2011 |

OTHER PUBLICATIONS

Li et al., "Machine-Vision-Based Surface Finish Inspection for Cutting Tool Replacement in Production", Int. J. Prod. Res.,, vol. 42, No. 11, pp. 2279-2287, Jun. 1, 2004.

Yan et al., "Extraction and Optimisation of Cutting Conditions for 2 1/2-Axis Milling", Int. J. Adv. Manuf. Technol, vol. 16, pp. 695-699, 2000.

Translation of JP office action drafted on Feb. 27, 2015 for a related JP application 2011-230218, which is a foreign counterpart to related U.S. Appl. No. 12/911,995.

Unofficial English Translation of Chinese Office Action issued in connection with corresponding CN Application No. 201110354647.0 on Mar. 31, 2015.

Jacobs et al., "The Characteristics of 78 Related Airfoil Sections From Tests in the Variable-Density Wind Tunnel", NACA Report No. 460, pp. 1-61, Nov. 1933.

Gutmark et al., "Enhancement of Heat Transfer in Plane Channels", Proceedings of the Seventh International Heat Transfer Conference, Munich,Germany, pp. 441-445, Sep. 6, 1982.

Minichiello et al., "Thermal Management of Sealed Electronic Enclosures using Synthetic Jet Technology", Advances in Electronic Packaging, vol. No. 2, Issue No. 19, pp. 1809-1812, 1997.

Black et al., "Heat Transfer Modules for Cooling Electronics Packages", Advanced Packaging Materials, Proceedings. 1998 4th International Symposium, pp. 209-214, Mar. 1998.

Negus et al., "Resistance of Circular Contacts on Coated Surfaces: Effect of Boundary Conditions", J. Thermophysics vol. No. 2, Issue No. 2, pp. 158-164, 1998.

Lee et al., "DNS of micro jets for turbulent boundary layer control", 39th Aerospace Sciences Meeting and Exhibit, Reno, NV, AIAA 2001-1013, pp. 1-13, 2001.

Mittal et al., "On Virtual Aero-Shaping Effect of Synthetic Jets", Physics. Fluids, vol. No. 14, Issue No. 4, pp. 1553-1536, 2002.

Garg et al., "Micro Fluidic Jets for Thermal Management of Electronics", Proc. ASME Heat Transfer/Fluids Engineering Summer Conference, Charlotte,North Carolina, FED F-346, vol. No. 4, pp. 647-654, Jul. 11, 2004.

Mahalingam et al., "Thermal Management Using Synthetic Jet Ejectors", IEEE Transactions on Components and Packaging Technologies, vol. No. 27, Issue No. 3, pp. 439-444, Sep. 2004.

Mahalingam et al., "Design and Thermal Characteristics of a Synthetic Jet Ejector Heat Sink", Journal of Electronic Pacckaging, Fluid Mechanics and Heat Transfer Research Labs, vol. No. 127, pp. 172-177, Jun. 2005

Acikalin et al., "Piezoelectric Actuators for Low-Form-Factor Electronics Cooling", The ASME/Pacific Rim Technical Conference and Exhibition on Integration and Packaging of Micro, Nano, and Electronic Systems (InterPACK '05), pp. 1339-4343, Jul. 17, 2005.

Erbas et al., "Synthetic Jets for Thermal Management of Microelectronic Chips", Microelectromechanical Systems, Proceeding of ASME IMECE 2005, IMECE 2005-81419, Orlando, FL, pp. 273-277, Nov. 5, 2005.

Garg et al., "Advanced Localized Air Cooling with Synthetic Jets", ASME Journal of Electronics Packaging, vol. No. 27, pp. 503-511, Dec. 2005.

Seeley et al., "Coupled Acoustic and Heat Transfer Modeling of a Synthetic Jet", 47th AIAA/ASME/ASCE/AHS/ASC Structures, Structural Dynamics and Materials Conference, pp. 1-13, May 1, 2006

Arik, "An Investigation into Feasibility of Impingement Heat Transfer and Acoustic Abatement of Meso Scale Synthetic Jets", Applied Thermal Engineering, pp. 1483-1494, Jun. 2006.

(56) References Cited

OTHER PUBLICATIONS

David B. Go et al., "Ionic Winds for Locally Enhanced Cooling", Journal of Applied Physics, vol. No. 102, Issue No. 5, pp. 1-9, 2007.

Arik et al., "Energy Efficiency of Low Form Factor Cooling Devices", ASME International Mechanical Engineering Congress and Exposition, Seattle, WA, pp. 1347-1354, Nov. 11, 2007

Utturkar et al., "Assessment of Cooling Enhancement of Synthetic Jet in Conjunction with Forced Convection", ASME International Mechanical Engineering Congress and Exposition, Seattle, WA, IMECE2007-41446, pp. 1-5, Nov. 11, 2007.

"Welcome to the World of Ventilation and Motor Engineering", http://www.ebmpapst.us/, pp. 1, Jan. 7, 2016.

Arik, "Local Heat Transfer Coefficients of a High Frequency Synthetic Jets During Impingement Cooling Over Flat Surfaces", Heat Transfer Engineering, vol. No. 29, Issue No. 9, pp. 763-773, 2008.

Arik et al., "Interaction of a Synthetic Jet With an Actively Cooled Heat Sink", General Electric Company Global Research Center, pp. 374-379, 2008.

Unofficial English translation of Japanese Office Action issued in connection with related JP Application No. 2010088256 on Jan. 28, 2014.

Utturkar et al., "An Experimental and Computational Heat Transfer Study of Pulsating Jets", J. Heat Transfer, vol. No. 130, Issue No. 6, pp. 1-10, Apr. 23, 2008.

I Phone 6 S, The Only Thing That's Changed is Everything, "http://www.apple.com/iphone/", pp. 1-8, Jan. 7, 2016.

Li et al., "Enhancement of Natural Convection using Synthetic Jets", GE Global Research, Benjamin Vanderploeg, Electronics Design ECOE, pp. 1-8, 2010.

Salapakkam et al., "Augmenting Forced Convection Heat Transfer Coupled with an Aerodynamic Surface and a Synthetic Jet", General Electric Global Research Center, pp. 1-9, 2010.

European Search Report and Opinion issued in connection with related EP Application No. 10158793.9 on Aug. 24, 2012.

European Search Report and Opinion issued in connection with related EP Application No. 11186013.6 on Dec. 18, 2012.

U.S. Appl. No. 14/327,687, filed Jul. 10, 2014, Pradeep Chandra Babu Salapakkam et al.

U.S. Appl. No. 12/911,995, filed Oct. 26, 2010, Mehmet Arik et al.

U.S. Appl. No. 14/302,613, filed Jun. 12, 2014, Mehmet Arik et al.

U.S. Appl. No. 13/074,700, filed Mar. 29, 2011, Mehmet Arik et al.

\* cited by examiner

SHAPED HEAT SINKS TO OPTIMIZE FLOW

CROSS REFERENCE TO RELATED APPLICATIONS

This application claims the priority and benefit of U.S. Provisional Application No. 61/285,564, entitled "ENERGY STORAGE DEVICE AND METHOD" filed on 11 Dec. 2009, which is incorporated in its entirety herein by reference.

TECHNICAL FIELD

The systems and techniques described relate generally to thermal management systems, and more particularly, to systems and methods for packaging synthetic jets.

DISCUSSION OF RELATED ART

As the size of semiconductor devices has continued to shrink and circuit densities have increased accordingly, thermal management of these devices has become more challenging. In the past, thermal management in semiconductor devices was often addressed through the use of forced convective air cooling, either alone or in conjunction with various heat sink devices, and was accomplished through the use of fans. However, simple fan-based cooling systems can be limited by several factors, including the physical constraints of the system to be cooled, the power available to run the fan, and noise associated with fan operation. While some applications may be able to generate cooling flow with a smaller fan, or with systems other than fans, such systems limit the amount of cooling flow, and therefore the total heat transfer available from such systems.

For electronic equipment cooling, the use of synthetic jets in conjunction with cooling fans can sometimes be used to improve the efficiency of heat removal. However, there is a need in the art for further improvements in such cooling systems to improve the overall efficiency of such systems.

BRIEF DESCRIPTION

In accordance with an embodiment of the systems described herein, a cooling system includes a base, a flow generator and an array of fins. The base is thermally connected to an object to be cooled and the flow generator provides for a cooling fluid flow across a surface of the base. The array of fins is thermally coupled to the base, each fin of the array extending in a vertical direction from the base and having an internal cavity that extends along the vertical direction within the fin, and a plurality of openings disposed on a downstream side of the fin relative to the cooling fluid flow. The openings provide fluid communication between the internal cavity and the cooling fluid flow. The array includes a first fin, a first synthetic jet, and a second fin. The first fin has a first cross-section shape taken in a plane normal to the vertical direction. The first pulsing synthetic jet is coupled to the internal cavity of the first fin. The second fin has a second cross-section shape taken in a plane normal to the vertical direction, disposed such that a chord of the first fin and a chord of the second fin are disposed along a single array line substantially parallel to the bulk motion of the cooling fluid flow. The first pulsing synthetic jet produces a flow oscillation at the plurality of openings on the first fin and the interaction of the flow oscillation with the cooling fluid flow produces a pair of vortices. A first vortex is shed from a first lateral side of the first fin, and a second vortex is shed from a second lateral side of the first fin. The first fin and the second fin are spaced longitudinally apart such that the first vortex passes to the first lateral side of the second fin and the second vortex passes to the second lateral side of the second fin.

In a further aspect of an embodiment of these systems, the first cross-section is symmetric about the chord of the first fin. Further, the downstream end of the first cross-section comprises a bifurcated rear surface normal to the chord and the rear surface has a recess which extends upstream from the rear surface and divides the rear surface into two laterally separate portions.

In another aspect of an embodiment of these systems, the second cross-section is symmetric about the chord of the second fin, and the upstream end of the second cross-section has an aerodynamic shape with a leading edge disposed upon the array line and a rounded surface that is normal to the chord at the leading edge.

In yet another aspect of the systems described herein, the leading edge of any fin downstream of another fin in an array is disposed behind the bifurcated rear surface of the adjacent upstream fin by a distance between about 80% and about 120% of the maximum lateral width of the fin cross-section.

BRIEF DESCRIPTION OF DRAWING FIGURES

The techniques and systems are described herein with reference to the drawings which contain the following figures, in which like reference numerals indicate like parts:

DETAILED DESCRIPTION

As noted above, many cooling applications depend on forced convection to remove thermal losses from temperature limited electronic devices. For a common electronics cooling solution requiring dissipation of 20 Watts or more of heat flow, a heat sink and fan are commonly used, especially for volume-constrained applications. The heat sink can be thermally attached to an individual device, to a number of devices via a board or perhaps module casing, or to a still larger system level casing. There are various heat sink types, for example, extruded fin, bonded fin, and folded fin. Factors to consider when deciding which type to specify for an application include the volume, surface area, material compatibility, fin efficiency, weight, cost, and attachment method, among others. The fan provides mechanical work to drive air through the heat sink. It requires power to do so, almost always in the form of electrical power. The fan volumetric flow rate, pressure rise, and fan efficiency characterize the fan power. The flow rate and pressure drop are strongly coupled to the heat sink design and performance. It is often desirable to optimize the heat sink design and performance for the lowest fan power.

While many variations of such systems will be known to those of skill in the art, it will be recognized that for any given combination, the use of a shape-optimized fin in combination with synthetic jets can provide a system that enhances the effective cooling of the same amount of cooling flow. This can be of special benefit for systems where power usage is to be minimized or cooling flow is limited or restricted.

Synthetic jets have been used for flow control in systems, and are often used to trigger turbulence in boundary layers of flow over a synthetic jet aperture. Use of synthetic jets in heat transfer has also been performed in the art. Such techniques have included using direct impingement of flow generated or excited by the synthetic jets on heated surfaces to be cooled. In particular, such systems may be effective in pulsing and disrupting the boundary caused by fan flow over cooling surfaces, such as fins, which can improve the heat transfer from the surface to the flow compared with forced convection.

While such systems combining synthetic jets with other cooling flow have provided improvements in cooling performance (as measured by a coefficient of performance calculated as the ratio of the heat energy removed to the energy input), further improvement in the performance of such cooling systems can be achieved by choosing particular shapes and configurations of heat sink features, such as cooling fins, in order to best utilize the effects of the synthetic jet upon the cooling flow.

Figure 1:
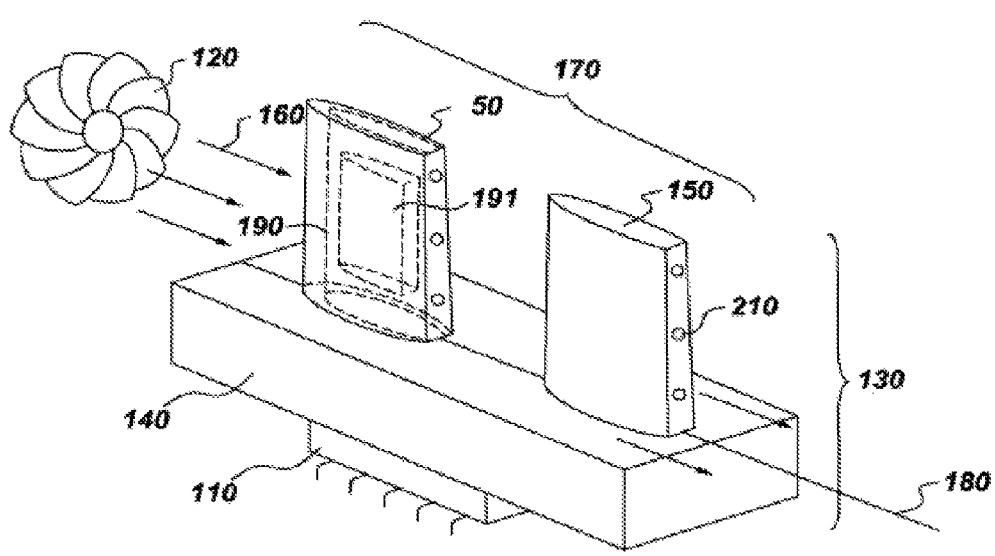
FIG. 1 illustrates a cooling system in accordance with one embodiment described herein.

One exemplary system that will be used in describing such an improved system is discussed below with reference to FIG. 1. FIG. 1 shows a system 100 that includes a device to be cooled, in this case an electronic component 110, a fan 120, and a heat sink 130 that includes a base 140 and projections, in this case fins 150. In general operation, the fan provides a cooling flow 160 of air, or another cooling fluid, that passes over the heat sink. The heat sink is connected to the electronic component in a way that provides for thermal communication of heat from the device to the heat sink. This heat flows through the heat sink base and into the cooling fins, which have surfaces over which flow from the fan passes, transferring heat into the cooling flow and passing it out of the system.

The fins 150 are arranged in an array 170. The array of fins represents a single group of fins that operate together as will be described in more detail below. In many practical embodiments, multiple arrays of fins will be disposed on the base 140. Some possible arrangements of such arrays will be discussed in greater detail below. The relation between the fins within a single array will be discussed first.

It will be appreciated that this generic system may be embodied using a variety of different configurations and alternatives for the various components identified. For instance, a system other than a fan 120 may be used to provide the cooling flow 160. In varying embodiments, such a flow may be generated by natural convection, pressure gradients caused by gravity or centrifugal force, the motion of the heat sink 130 itself through a stationary body of fluid, pumps, or other techniques as known in the art. Similarly, the component to be cooled need not be an electronic component, but could be any device that requires cooling.

Although the illustrated embodiment shows the heat sink 130 disposed directly upon the electronic component 110, heat transfer systems that draw heat from the component to the heat sink may be used to allow for different packaging between the component and heat removal components. In addition, combinations of various heat sink improvement devices beyond the fins 150 described may also be included, and in some instances, the techniques described below may be used with such components as well as with the illustrated fins.

A variety of cooling fin shapes are known in the art, including radial fins, pin fins, and longitudinal fins. Although each may be used to provide heat transfer between the base 140 and the flow 160, it is desirable that the surface provide not only a good surface area for transfer of heat, but also not cause any more pressure drop in the cooling flow than necessary. Increases in the pressure drop, which can be associated with increased drag caused by the flow over the fins, will require more motive power from the fan or other flow generator, which will reduce the overall cooling efficiency of the system.

As noted above, the inclusion of synthetic jets can be used to improve the heat transfer between the fins 150 and the flow 160. However, in order to provide appropriate benefit to such synthetic jets without inducing additional pressure drop that reduces the performance of the system, it is desirable to properly shape and position the fins relative to the cooling flow in a way that takes best advantage of the benefits provided by the synthetic jets. As discussed throughout, it will be understood that synthetic jets can be disposed in a variety of positions and still be effective for the purposes described herein. In varying embodiments, the synthetic jets may be disposed within the heat sink base, within a cover or other attachment that connects to the fins of the heat sink, within the heat sink fins themselves, or in any other location that provides the ability to pulse flow at the openings 210 of the fins via the action of the synthetic jet.

As can be seen in FIG. 1, the flow 160 moves in a path over the base 140. Although the path need not be precisely linear, the bulk motion of the flow across the base will generally follow a linear path away from the flow source (or other region of high pressure), and at any given point, a direction of the bulk motion for the flow can be defined. Such streamlines (in steady state flow) define the path that the flow will take, and at small scales, these paths can be considered linear. It will be understood that curved paths are possible, and that the systems and techniques described herein can be used with systems that have such curved paths. However, the exemplary embodiment shown will be based on a linear flow path.

A line along the base 140 that follows the flow path that will be referred to as an "array line" 180 is shown in FIG. 1. As noted above, the flow 160 may not be purely linear, but the array line is intended to follow the local path of the flow over the base. In the illustrated embodiment, the fins 150 are arranged in a way that align the chord of the fin with the bulk flow direction. By this arrangement, the flow along a particular flow path associated with an array line will flow over and around each fin in a particular array 170.

Certain terms will be defined to address directions and axes within the figures. A "vertical" direction will be defined as a direction generally away from base 140 of the heat sink 130 and normal to the surface of the base. A "longitudinal" direction will be a direction along an axis generally aligned with the bulk motion of the flow along the base, and generally normal to the vertical direction. An "upstream" direction is a direction along the longitudinal axis from which the bulk flow comes, i.e. in a direction toward a higher pressure, while a "downstream" direction is in a direction in which the bulk flow proceeds, i.e. towards a lower pressure along the longitudinal axis. As defined, these terms are meant to clarify the relation of the elements discussed, but should not be taken to refer to any broader sense to components not described. For instance, the presence of a cooling system within a moving vehicle should not be taken to require the "vertical" axis be aligned with gravity, or that the "downstream" direction be aligned with flow over the vehicle's exterior. A "lateral" direction is a direction normal to the vertical and longitudinal directions.

As shown in the embodiment of FIG. 1, a plurality of fins 150 may be disposed along the array line 180 to form a single array 170. Each fin may have a generally constant external cross section as the fin extends vertically. Although it will be recognized that the cross-section in a plane normal to the vertical direction may vary along the fin and that the described systems may be applied to such fins, the discussion below will treat the cross-section as a constant for the purposes of simplicity.

The illustrated fins 150 have a hollow space 190 within the fin, and each fin has this space connected to a pulsing mechanism, such as a synthetic jet 191. The fin includes at least one opening 210 on the downstream end of the fin that provides fluid communication between the hollow and the cooling flow, where a closed leading edge of the fin is free of openings, and where closed sides are free of openings as clearly depicted in FIG. 1. In operation, the synthetic jet 191 provides alternating pressure pulses to the space within the fin that result in oscillating flow in and out of the openings.

The design and connection of such synthetic jets to the fins 150 is described in further detail in co-pending U.S. patent application Ser. No. 12/759,899 entitled "CHASSIS WITH DISTRIBUTED JET COOLING", filed on 14 Apr. 2010, co-pending U.S. patent application Ser. No. 12/421,068 entitled "HEAT SINKS WITH DISTRIBUTED AND INTEGRATED JET COOLING", filed on 9 Apr. 2009, and co-pending U.S. patent application Ser. No. 12/911,995 entitled "THERMAL MANAGMENT SYSTEM AND METHOD", filed on 26 Oct. 2010, each of which is hereby incorporated herein by reference in its entirety. It will be appreciated that a variety of arrangements of the synthetic jet with respect to the fins may used without altering the benefits of the systems described.

Figure 2:
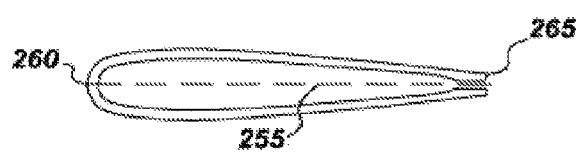
FIG. 2 illustrates a cross-section of an aerodynamic fin in accordance with one embodiment described herein.
Figure 3:
FIG. 3 illustrates a cross-section of an inverted fin in accordance with one embodiment described herein.
Figure 4:
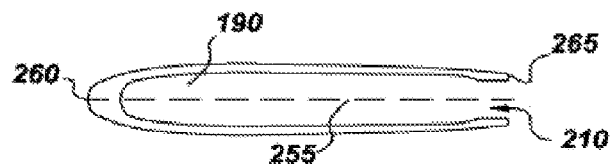
FIG. 4 illustrates a cross-section of a hybrid fin in accordance with one embodiment described herein.

Various possible cross-sections for fins can be used. As discussed above, it is beneficial in various embodiments to provide a cross-section that minimizes pressure drop caused by the presence of the fin in the flow, while also providing appropriate heat transfer between the fin and the flow over the fin, and accommodating the benefits that can be provided by the synthetic jet. FIGS. 2-4 show some alternate cross-sections that may be used for embodiments of the fins 150.

FIG. 2 illustrates an exemplary cross-section of a fin. This shape will be referred to generally as an aerodynamic fin 250. The particular illustrated fin is based on a NACA 4 series airfoil. The fin has a chord 255, defined as the line segment joining the leading edge 260 of the fin 250 and the trailing edge. In the illustrated embodiment, the trailing edge is not a single point, but rather a rear surface 265. The chord is drawn to the center of the rear surface. The cross-section is symmetric about the chord 255. The rear surface 265 may be discontinuous because of the presence of the openings 210 in the rear surface of the fin 250.

The upstream side of the cross-section includes an aerodynamic shape that is normal to the chord 255 at the leading edge 260 on the upstream side of the fin, and curves smoothly back from the leading edge on each side. A maximum lateral width is reached and then the width tapers toward the rear surface 265. Such an aerodynamic airfoil is characterized by having a low pressure drop. However, for a given amount of bulk flow and heat to be removed from the base, the aerodynamic fin provides less heat transfer compared to, for example, the embodiment illustrated in FIG. 3, below. This results a higher surface temperature for such fins.

FIG. 3 illustrates a cross-section of an alternate embodiment of a fin. This shape will be referred to as an inverted fin 270. The illustrated fin is again based on a NACA 4 series airfoil, but the airfoil is reversed within the flow so as to present a sharply pointed leading edge 260 on the upstream side that gradually widens laterally to a maximum width. The trailing edge of the fin is truncated to a flat rear surface 265, which again may be bifurcated by the presence of the opening 210 to the hollow space 190 within the fin. Such a fin shape provides for enhanced heat transfer (which keeps the fin cooler for the same amount of heat dissipation and bulk flow), but causes a higher pressure drop than a similarly sized aerodynamic fin, therefore requiring more energy to provide sufficient cooling flow.

FIG. 4 illustrates a cross-section of another embodiment of a fin that provides a combination of the features of the aerodynamic fin and the inverted fin. Fins with this cross-sectional shape will be referred to as hybrid fins 280. The hybrid fin uses an aerodynamic upstream cross-section with a leading edge 260 normal to the chord 255 and curving sides. The hybrid fin 280 then has sides parallel to the chord which maintain the maximum lateral width for a significant length of the fin. The downstream portion tapers slightly to a truncated rear surface 265 similar to that of the inverted fin 270.

For comparable bulk flow and heat to be dissipated, the hybrid fin 280 provides a heat transfer in between that of the inverted fin and the aerodynamic fin, while causing a pressure drop closer to that of the aerodynamic fin than the inverted fin. The overall result is that the hybrid fin 280 provides increased heat transfer performance for a given driving power because of the lower pressure drop compared to the high heat-transfer cross-sections. This reduction in the need for driving power improves the coefficient of performance of this cross-sectional shape.

Figure 5:
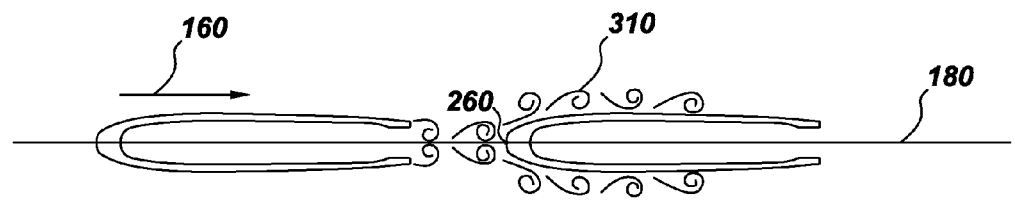
FIG. 5 illustrates a pair of adjacent fins in accordance with one embodiment described herein.

In operation, we see that the hybrid shape particularly benefits from interactions of the synthetic jets with the flow over the fins 150 downstream from those jets. This will be discussed further with reference to FIG. 5. FIG. 5 shows two fins 150 of a single array 170. These fins are adjacent in the array, that is, moving downstream along the array line 180, no other fins are found between the two illustrated fins. The operation of the synthetic jet within the upstream fin 300 causes a series of vortices 310 to be periodically shed from the upstream fin. These vortices are caused by the interaction of the oscillating flow through the opening 210 in the fin and the cooling flow 160 around the lateral sides of the fin.

As each vortex 310 is shed from one of the sides of the upstream fin 300, it propagates downstream with the cooling flow 160, producing enhanced mixing within the flow. As the vortex reaches the downstream fin 320, it is desirable that the vortex pass along one lateral side or the other of the downstream fin, rather than impinging directly upon the leading edge 260, or being deflected away from the downstream fin. As the vortex passes along the surface of the downstream fin, it provides a mechanism for heat to move more effectively across the boundary at the surface of the downstream blade, and it helps to prevent the thermal boundary layer along the downstream blade from thickening undesirably.

In order to place these vortices 310 so that they pass along the sides of the downstream fin 320 and produce an effective control of the downstream thermal boundary layer, it is desirable that the spacing between the rear surface 265 of the upstream fin 300 and the leading edge 260 of the downstream fin be maintained at an appropriate distance. Although this distance can vary based upon various flow parameters, in one embodiment, the separation between the rear surface of the upstream fin and the leading edge of the downstream fin is approximately equal to the maximum lateral thickness of the fin. In other embodiments, such spacing may range from about 75%, about 80%, or about 90% of the maximum fin thickness to about 110%, about 120% or about 125% of the maximum fin thickness. By use of the shed vortices to control the boundary layers of the downstream fin, the pulsing action of the synthetic jets allows for enhanced cooling performance of the fins without increasing the bulk cooling flow rate and with relatively low power input.

As each vortex 310 passes along the downstream fin 320, the strength of the vortex will dissipate. Each fin is sized to desirably allow the vortex to dissipate sufficiently to not interfere with the flow around any fins further downstream of the downstream fin, while still producing effective cooling benefits. In one embodiment, the hybrid fin has a chord length equal to about 5.5 times the maximum lateral width. In other embodiments, this ratio may be within the range from about 4.5 to 6.5 times the maximum lateral width of the fin.

As shown, the shape of the heat sink can be an important factor in obtaining low thermal resistance and high heat transfer while limiting the pressure drop across the array as a whole. The synthetic jets are embedded inside the fins such that in effect, each synthetic jet cools the leading edge and surface of the next adjacent downstream fin.

Figure 6:
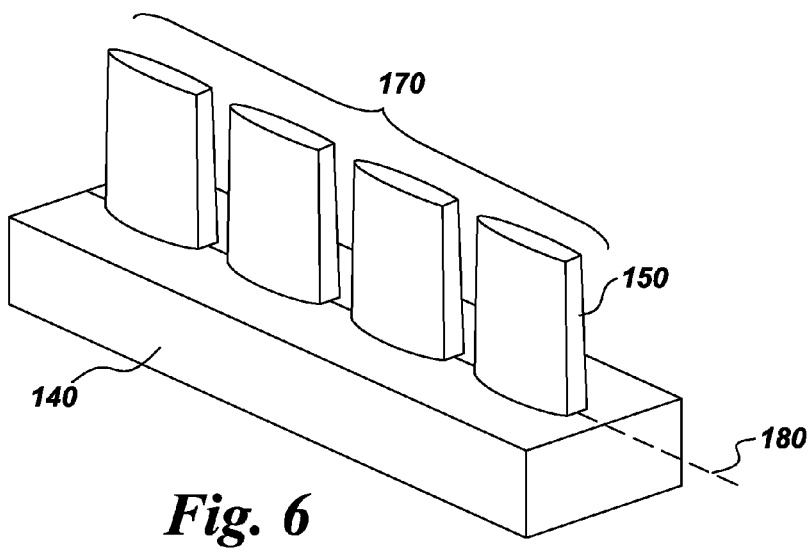
FIG. 6 illustrates an array of fins from FIG. 5.

Although FIG. 5 shows a single upstream/downstream pair of fins 150, it will be appreciated that the same mechanism may be used at each of the plurality of fins within an array 170, as shown in FIG. 6. By using this mechanism at each fin/fin interaction within the array, the action of the synthetic jets can be used to maintain effective cooling at each fin in the array, while minimizing the disruptions caused to the downstream flow by those fins located upstream. Also note that the action of the synthetic jet in any fin is directed to primarily benefit the flow over the adjacent downstream fin. While not required, beneficial results may be observed when the primary shed vortices 310 interact with the adjacent fin immediately downstream of the upstream fin 300 only.

Also, note that the array 170 need not include identical fins 150 at every station along the array line 180. In particular, it should be noted that the most upstream fin may not receive any benefit from synthetic jet induced alterations in its flow, so there may be advantages to altering the upstream side contour of this fin or provide alternate means, such as independent synthetic jet pulsing from the base 140 to assist in the heat transfer of the most upstream blade.

Similarly, the most downstream blade in the array 170 need not include a synthetic jet if there is no benefit to providing further vortices 310 or mixing downstream of that blade. Such alterations of the initial and final fins 150 in the array do not alter the techniques described, but may be combined with these techniques to provide an overall improvement in cooling system design.

Having discussed a single array 170, it will be recognized that multiple arrays of fins 150 may be disposed upon a single base 140 in order to provide for improved performance. Some exemplary configurations are discussed below.

Figure 7:
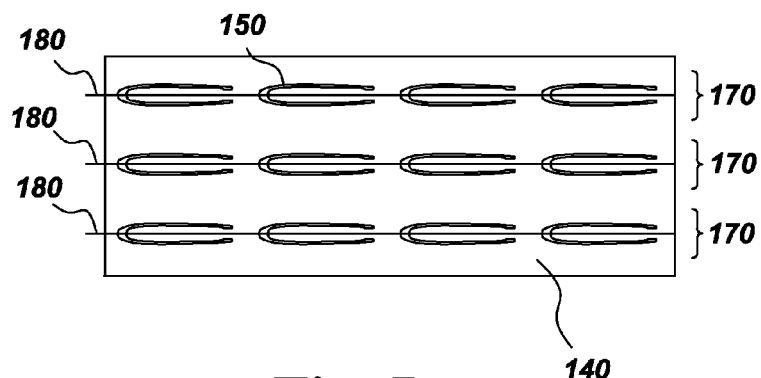
FIG. 7 illustrates an arrangement of arrays of FIG. 6 in accord with an embodiment described herein.

FIG. 7 illustrates a base 140 having multiple parallel arrays 180. Each array is aligned with the flow, making such an arrangement suitable when the flow over the entire base is substantially parallel. It will be appreciated that the lateral spacing of the arrays may be aerodynamically significant, and in particular, in order to avoid having the vortices shed from the fins of one array interfere with the flow over the laterally adjacent array, sufficient spacing may be desired. In one exemplary embodiment, the spacing between adjacent arrays is such that the array lines are separated by a distance approximately twice the maximum thickness of the fins 150 within the arrays 180. This provides for a minimum of approximately one fin-thickness of lateral space between any laterally adjacent blades. In varying embodiments, such spacing may range anywhere from about 170% of the maximum fin thickness, 180% of the maximum thickness, or 190% of the maximum thickness to about 210%, 220% or 230% of the maximum blade thickness.

Figure 8:
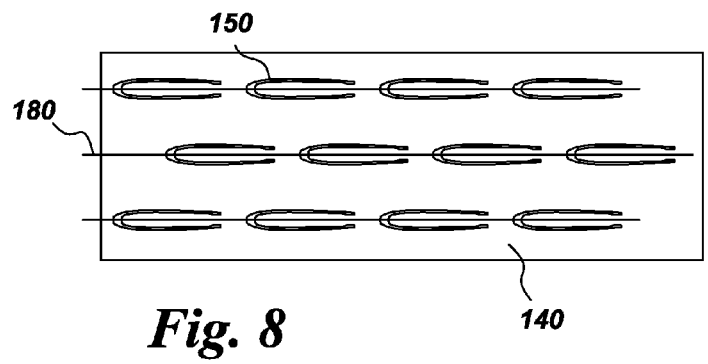
FIG. 8 illustrates an alternate arrangement of arrays as described with respect to one embodiment herein.

Spacing may also be adjusted in other ways, such as by using longitudinally offset arrays as illustrated in FIG. 8. Although the array lines 180 are parallel, just as in FIG. 7, the leading edge of the first blade in each array is offset along the array line so that the fins in one array do not line up longitudinally with the fins in the laterally adjacent array. A pattern with two different longitudinal offsets is illustrated, but it will be appreciated that configurations with multiple offsets can be produced.

Figure 9:
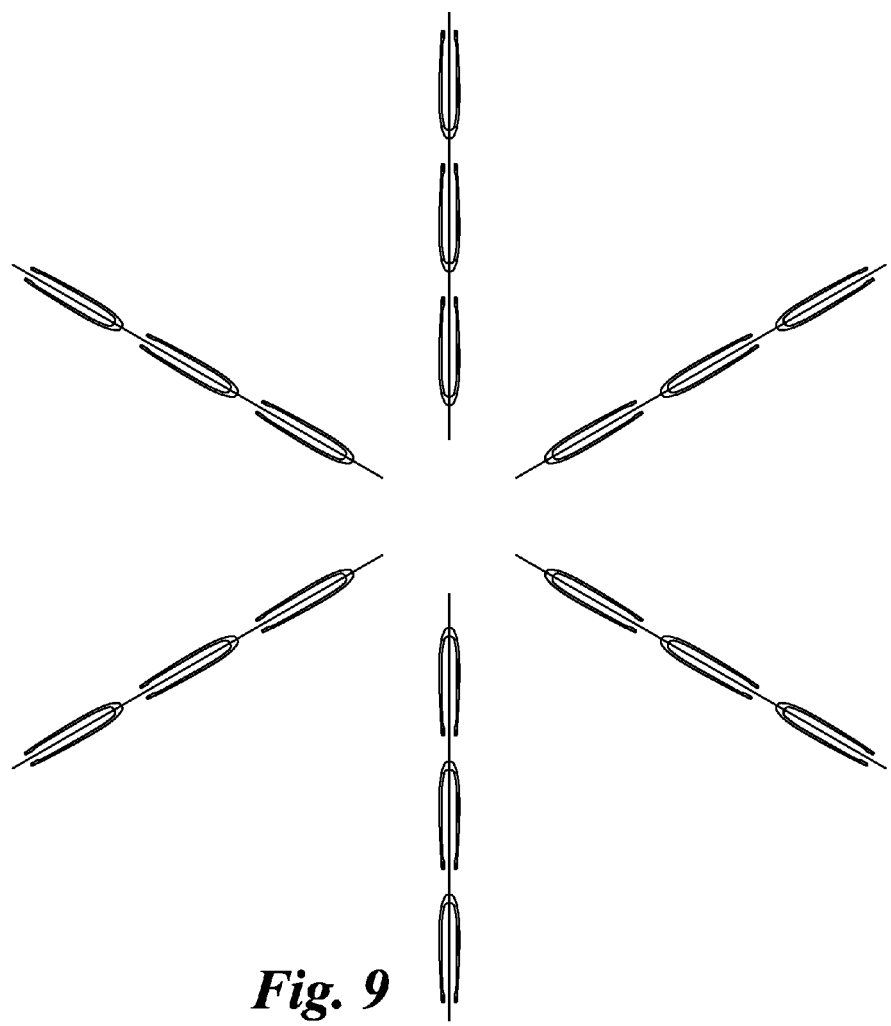
FIG. 9 illustrates yet another arrangement of arrays of fins as described with respect to another embodiment herein.

Another embodiment is shown in FIG. 9. This arrangement of arrays 170 shows arrays that are parallel to the local flow at different areas, but are not parallel to one another. In particular, this radial arrangement of array lines 180 can be effective when, for example, a cooling flow is blown down at the base from above, and then spreads radially from the center of the impingement of the bulk flow upon the base 140. As noted above, each array has essentially linear flow, however, the flow is divergent from a central location so that one array is not parallel to the adjacent arrays.

Although not described herein, a variety of control systems to manage the frequency and phase of synthetic jet pulsing can be used to provide appropriate flow within the arrays. For instance, synchronous pulsing of all jets within a single array may be effective for providing effective flow within an array in one embodiment. In other embodiments, staggered pulsing of jets may produce better effects, or may help to minimize the effect of one array upon an adjacent array if the arrays are pulsed out of sequence. It will be understood that a variety of such control schemes and systems may be used to enhance the desired effects.

The various embodiments described herein may be examples of shaped heat sinks for improved cooling. Any given embodiment may provide one or more of the advantages recited, but need not provide all objects or advantages recited for any other embodiment. Those skilled in the art will recognize that the systems and techniques described herein may be embodied or carried out in a manner that achieves or optimizes one advantage or group of advantages as taught herein without necessarily achieving other objects or advantages as may be taught or suggested herein.

This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. Thus, it is intended that the scope of the invention disclosed should not be limited by the particular disclosed embodiments described above, but should be determined only by a fair reading of the claims that follow.

What is claimed is:

1. A cooling system comprising:
a base thermally connected to an object to be cooled;
a flow generator that provides for a cooling fluid flow across a surface of the base;
a first array of fins thermally coupled to the base, each fin having an internal cavity within the fin, a closed leading edge that faces a direction from which the cooling fluid flow is flowing and that is free of openings, closed sides free of openings, and at least one opening disposed only on a downstream side of the fin relative to the cooling fluid flow that provides fluid communication between the internal cavity and the cooling fluid flow, the first array of fins further comprising:
a first fin having a first cross-section shape;
a first pulsing synthetic jet disposed within the internal cavity of the first fin;
a second fin having a second cross-section shape, disposed such that a chord of the first fin and a chord of the second fin are disposed along a single array line substantially parallel to a bulk motion of the cooling fluid flow,
wherein the first pulsing synthetic jet produces a flow oscillation at the at least one opening on the first fin and the interaction of the flow oscillation with the cooling fluid flow produces a pair of vortices, a first vortex being shed from a first lateral side of the first fin, and a second vortex being shed from a second lateral side of the first fin, and wherein the first fin and second fin being spaced longitudinally apart such that the first vortex passes to a first lateral side of the second fin and the second vortex passes to a second lateral side of the second fin.

2. A cooling system as in claim 1, wherein the first cross-section is symmetric about the chord of the first fin, and a downstream end of the first cross-section comprises a bifurcated rear surface normal to the chord, and wherein the at least one opening comprises an opening defined by the bifurcated rear surface, the opening extending upstream from the rear surface and dividing the rear surface into two laterally separate portions.

3. A cooling system as in claim 2, wherein the second cross-section is symmetric about the chord of the second fin, and an upstream end of the second cross-section comprises an aerodynamic shape having a leading edge disposed upon the array line and having a rounded surface that is normal to the chord at the leading edge.

4. A cooling system as in claim 3, wherein the leading edge of the second fin is disposed behind the bifurcated rear surface of the first fin by a distance between about 80% and about 120% of the maximum lateral width of the first cross-section.

5. A cooling system as in claim 3, wherein the cross-sections of the first fin and the second fin comprise sides that are parallel to the chord and which connect a downstream portion of the rounded surface with the bifurcated rear surface.

6. A cooling system as in claim 1, further comprising a second array of fins.

7. A cooling system as in claim 6, wherein the second array of fins is disposed along an array line parallel to the array line of the first array of fins.

8. A cooling system as in claim 6, wherein a lateral distance between the array line of the first array of fins and the array line of the second array of fins is between about 170% and 230% of the maximum lateral width of the first cross section.

9. A cooling system as in claim 1, further comprising:
a third fin having a third cross-section shape taken in a plane normal to the vertical direction, disposed such that a chord of the third fin lies along the array line;
a second pulsing synthetic jet coupled to the internal cavity of the second fin,
wherein the second pulsing synthetic jet produces a flow oscillation at the plurality of openings on the second fin and the interaction of the flow oscillation and the cooling fluid flow produces at least a pair of vortices, a third vortex being shed from a first lateral side of the second fin, and a fourth vortex being shed from a second lateral side of the second fin, and wherein the second fin and the third fin being spaced longitudinally apart such that the third vortex passes to a first lateral side of the third fin and the fourth vortex passes to a second lateral side of the third fin.

10. An array of cooling fins disposed in a cooling flow, the array comprising:
a plurality of fins disposed upon a base in thermal communication with an object to be cooled, each of the plurality of fins having a cross-section defining a leading edge, a chord, and a width of the fin, wherein the chord of each of the plurality of fins is disposed along an array line that extends parallel to a bulk motion of the cooling flow, each fin comprising:
an internal cavity;
at least one opening disposed on a downstream side of the fin relative to the cooling flow; and
a pulsing synthetic jet disposed within the base or within the internal cavity of the fin;
wherein the leading edge of each fin comprises a closed leading edge that faces a direction from which the cooling fluid flow is flowing and that is free of openings, and closed sides free of openings;
wherein the pulsing synthetic jet produces a flow oscillation at the at least one opening on each fin, and the interaction of the flow oscillation with the cooling flow produces a pair of vortices, a first vortex being shed from a first lateral side of the fin, and a second vortex being shed from a second lateral side of the fin,
wherein each fin is spaced apart longitudinally from an adjacent downstream fin in the array such that the first vortex shed from a fin passes to a first lateral side of the adjacent downstream fin and the second vortex passes to a second lateral side of the adjacent downstream fin.

11. An array as in claim 10, wherein the cross-section is symmetric about the chord of the fin, and a downstream end of the cross-section comprises a bifurcated rear surface normal to the chord, and wherein the at least one opening comprises an opening defined by the bifurcated rear surface, which extends upstream from the rear surface and divides the rear surface into two laterally separate portions.

12. An array as in claim 10, wherein the cross-section is symmetric about the chord of the second fin, and an upstream end of the cross-section comprises an aerodynamic shape having a leading edge disposed upon the array line and having a rounded surface that is normal to the chord at the leading edge.

13. An array as in claim 11, wherein a leading edge of any fin downstream of another fin of the array is disposed behind the bifurcated rear surface of the adjacent upstream fin by a distance between about 80% and about 120% of the maximum lateral width of the fin cross-section.

14. An array as in claim 11, wherein the cross-section of the fin comprises sides that are parallel to the chord and which connect a downstream portion of the rounded surface with the bifurcated rear surface.

15. A cooling system comprising:
a flow generator that generates a cooling fluid flow;
a plurality of arrays of cooling fins disposed in the cooling flow, wherein each array of cooling fins comprises:
a plurality of fins disposed upon a base in thermal communication with an object to be cooled, each of the plurality of fins having a cross-section defining a leading edge, a chord, and a width of the fin, wherein the leading edge is positioned and oriented to face the cooling fluid flow generated by the flow generator and the chord of each of the plurality of fins is disposed along an array line that extends parallel to a bulk motion of the cooling flow, each fin comprising:
an internal cavity;
at least one opening disposed on a downstream side of the fin relative to the cooling flow;
sides extending between the leading edge and the downstream side that are free of openings; and
a pulsing synthetic jet disposed within the base or within the internal cavity of the fin;
wherein the leading edge comprises a closed surface free of openings, such that the cooling flow is caused to blow past and around the leading edge;
wherein the pulsing synthetic jet produces a flow oscillation at the at least one opening on each fin, and the interaction of the flow oscillation with the cooling flow produces a pair of vortices, a first vortex being shed from a first lateral side of the fin, and a second vortex being shed from a second lateral side of the fin; and
wherein each fin is spaced longitudinally from an adjacent downstream fin in the array such that the first vortex shed from a fin passes to a first lateral side of the adjacent downstream fin and the second vortex passes to a second lateral side of the adjacent downstream fin.

16. A cooling system as in claim 15, wherein the plurality of arrays has array lines that are parallel to one another.

17. A cooling system as in claim 16, wherein a lateral distance between the array lines of the plurality of arrays is between about 170% and 230% of the maximum lateral width of the cross section.

* * * * *